(12) United States Patent
Shrivastava et al.

(10) Patent No.: US 11,671,135 B2
(45) Date of Patent: Jun. 6, 2023

(54) METHODS AND APPARATUS FOR REDUCING SWITCHING TIME OF RF FET SWITCHING DEVICES

(71) Applicant: pSemi Corporation, San Diego, CA (US)

(72) Inventors: Ravindranath D. Shrivastava, San Diego, CA (US); Fleming Lam, San Diego, CA (US); Payman Shanjani, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 63 days.

(21) Appl. No.: 17/492,199

(22) Filed: Oct. 1, 2021

(65) Prior Publication Data

US 2023/0105033 A1    Apr. 6, 2023

(51) Int. Cl.
*H04B 1/40*     (2015.01)
*H03F 3/24*     (2006.01)
*H03H 11/28*    (2006.01)

(52) U.S. Cl.
CPC ............... *H04B 1/40* (2013.01); *H03F 3/245* (2013.01); *H03H 11/28* (2013.01); *H03F 2200/294* (2013.01); *H03F 2200/451* (2013.01)

(58) Field of Classification Search
CPC ..... H04B 1/40; H03F 3/245; H03F 2200/294; H03F 2200/451; H03H 11/28
See application file for complete search history.

(56) References Cited

U.S. PATENT DOCUMENTS

| | | | |
|---|---|---|---|
| 7,910,993 B2 | 3/2011 | Brindle et al. | |
| 9,143,124 B2 | 9/2015 | Cam et al. | |
| 9,184,731 B2 | 11/2015 | Lam | |
| 9,893,722 B2 | 2/2018 | Mokalla | |
| 9,941,347 B2 | 4/2018 | Shapiro et al. | |
| 10,236,872 B1 | 3/2019 | Willard et al. | |
| 10,396,772 B2 * | 8/2019 | Shanjani | H03K 17/04123 |
| 10,454,529 B2 | 10/2019 | Kerr | |
| 10,461,729 B2 | 10/2019 | Kerr et al. | |
| 10,608,623 B2 | 3/2020 | Kerr et al. | |
| 10,763,842 B1 | 9/2020 | Dai | |

(Continued)

FOREIGN PATENT DOCUMENTS

| | | |
|---|---|---|
| KR | 20160131926 A | 11/2016 |
| WO | 2013/017696 A1 | 2/2013 |

OTHER PUBLICATIONS

Non-Final Office Action for U.S. Appl. No. 17/321,363, filed May 14, 2021, dated Sep. 15, 2021, 14 pages.

(Continued)

*Primary Examiner* — Nguyen T Vo
(74) *Attorney, Agent, or Firm* — Steinfl + Bruno, LLP

(57) ABSTRACT

An apparatus for reducing switching time of RF FET switching devices is described. A FET switch stack includes a stacked arrangement of FET switches and a plurality of gate feed arrangements, each coupled at a different height of the stacked arrangement. A circuital arrangement with a combination of a series RF FET switch and a shunt RF FET switch, each having a stack of FET switches, is also described. The shunt switch has one or more shunt gate feed arrangements with a number of bypass switches that is less than the number of FET switches in the shunt stack.

23 Claims, 10 Drawing Sheets

(56) References Cited

U.S. PATENT DOCUMENTS

| | | | |
|---|---|---|---|
| 10,886,911 B2 | 1/2021 | Willard et al. | |
| 10,897,246 B2 | 1/2021 | Scott et al. | |
| 11,290,001 B2 | 3/2022 | Zhang et al. | |
| 11,405,031 B1 | 8/2022 | Shrivastava et al. | |
| 11,405,034 B1 | 8/2022 | Shapiro et al. | |
| 11,405,035 B1 | 8/2022 | Genc et al. | |
| 2003/0090313 A1* | 5/2003 | Burgener | H03K 17/6871 327/408 |
| 2013/0033307 A1 | 2/2013 | Lin | |
| 2013/0115895 A1* | 5/2013 | Crandall | H01L 27/1203 455/73 |
| 2016/0329891 A1 | 11/2016 | Bakalski et al. | |
| 2017/0302259 A1 | 10/2017 | Mokalla | |
| 2018/0048273 A1* | 2/2018 | Goldblatt | H03F 1/0277 |
| 2018/0175851 A1 | 6/2018 | Kerr et al. | |
| 2019/0206863 A1* | 7/2019 | Blin | H03K 17/6871 |
| 2019/0305768 A1 | 10/2019 | Willard et al. | |
| 2021/0075420 A1 | 3/2021 | Kovac et al. | |
| 2021/0167773 A1 | 6/2021 | Burgener | |
| 2022/0038098 A1* | 2/2022 | Malladi | H04B 1/40 |

OTHER PUBLICATIONS

Final Office Action for U.S. Appl. No. 17/321,363, filed May 14, 2021 on behalf of PSEMI Corporation dated Mar. 15, 2022 15 pages.
International Search Report and Written Opinion for PCT/US2022/029042 filed on May 12, 2022 on behalf of PSEMI Corporation dated Sep. 6, 2022 11 pages.
Non-Final Office Action for U.S. Appl. No. 17/374,927, filed Jul. 13, 2021 on behalf of PSEMI Corporation dated Apr. 14, 2022 9 pages.
Non-Final Office Action for U.S. Appl. No. 17/492,180, filed Oct. 1, 2021 on behalf of PSEMI Corporation dated Aug. 2, 2022, 18 pages.
Notice of Allowance for U.S. Appl. No. 17/321,363, filed May 14, 2021, on behalf of pSemi Corporation. dated Apr. 28, 2022. 8 Pages.
Notice of Allowance for U.S. Appl. No. 17/403,758, filed Aug. 16, 2021, on behalf of pSemi Corporation. dated May 25, 2022. 9 Pages.
Notice of Allowance U.S. Appl. No. 17/374,927, filed Jul. 13, 2021, on behalf of PSEMI Corporation. dated May 11, 2022. 8 Pages.
International Search Report and Written Opinion for International PCT Application No. PCT/US2022/077069 filed Sep. 27, 2022, on behalf of pSemi Corporation, dated Jan. 20, 2023, 11 Pages.

\* cited by examiner

METHODS AND APPARATUS FOR REDUCING SWITCHING TIME OF RF FET SWITCHING DEVICES

CROSS-REFERENCE TO RELATED APPLICATIONS

The present application may be related to U.S. patent application Ser. No. 17/321,363 filed on May 14, 2021 for a "Body Resistor Bypass For RF Switch Stack", U.S. patent application Ser. No. 17/374,927 filed on Jul. 13, 2021 for a "Gate Resistor Bypass For RF FET Switch Stack" and U.S. patent application Ser. No. 17/403,758 filed on Aug. 16,2021 for a "Gate Resistor Bypass For RF FET Switch Stack", all co-owned by Applicant, all of which are incorporated herein by reference in their entirety.

FIELD

The present disclosure relates to integrated circuit devices, and more particularly to methods and apparatus for reducing the switching time by increasing the number of gate and/or body feed arrangements of RF FET switching devices.

BACKGROUND

FIG. 1 shows a schematic representation of an RF switch FET stack (110) with input RFIN and output RFOUT. FET stack (110) is biased through resistor networks, such as body, drain/source and gate rail/rung resistor ladders, of which only gate resistor ladder (120) is shown in the figure, for ease of reference. Also shown is a gate control block or gate feed arrangement (130) to control the bias on the gate terminals of the FETs of the FET stack. Gate feed arrangement (130) is centrally located with respect to FET stack (110) and includes one or more transition-dependent gate bias feed bypass resistors (also called dynamic resistors), as described, for example, in U.S. Pat. No. 10,396,772, incorporated herein by reference in its entirety.

SUMMARY

The present disclosure provides an improvement in gate voltage settling time by providing multiple feed points and modifying the feed network stack height depending upon the application of the switch.

According to a first aspect, a FET switch stack is provided, comprising: a stacked arrangement of FET switches proceeding from a bottom FET switch to a top FET switch, wherein a position of a FET switch inside the stacked arrangement defines a corresponding height in the stacked arrangement, said height going from a minimum height corresponding to the bottom FET switch to a maximum height corresponding to the top FET switch, the stacked arrangement connected at one end to an RF terminal configured to be coupled to an RF signal, the stacked arrangement configured to have an ON steady state where the FET switches are ON, an OFF steady state where the FET switches are OFF, and transition states where the FET switches are transitioning from ON to OFF and vice versa; and a plurality of gate feed arrangements, each gate feed arrangement being coupled to the stacked arrangement at a different height of the stacked arrangement and comprising one or more bypass switches connected across one or more common gate resistors, said each gate feed arrangement configured to feed a control signal to gates of the FET switches to control the ON steady state, the OFF steady state and the transition states of the stacked arrangement.

According to a second aspect, a FET switch stack is provided, comprising: a stacked arrangement of FET switches including a bottom FET switch, a top FET switch, and a plurality of intermediate FET switches connected in series between the bottom FET switch and the top FET switch, the stacked arrangement having a height extending between the bottom FET switch and the top FET switch; a body charge control ladder comprising a plurality of rung branches and a plurality of rail branches, each rail branch being connected between two rung branches, each rung branch being connected between one or more rail branches and a body of a FET switch in the stacked arrangement of FET switches; and a plurality of body charge control feeds each comprising a plurality of bypas sable resistors connected in series and a plurality of bypass switches, each bypass switch being connected across one or more corresponding bypassable resistors, each body charge control feed being coupled to the body charge control ladder, the body charge control feeds being offset from each other along the body charge control ladder.

According to a third aspect, a circuital arrangement is provided, comprising: a combination of a series RF switch and a shunt RF switch, the series RF switch connected between a first RF terminal and a second RF terminal, the shunt RF switch connected between the second RF terminal and ground, the shunt RF switch configured to be in an ON steady state when the series RF switch is in an OFF steady state and vice versa, each of the series RF switch and the shunt RF switch comprising a stacked arrangement of respective N and M FET switches; and a plurality of series gate feed arrangements coupled to gates of the FET switches of the series RF switch, and one or more shunt gate feed arrangements coupled to gates of the FET switches of the shunt RF switch, each series gate feed arrangement and shunt gate feed arrangement comprising respective K and L bypass switches connected across one or more common gate resistors, wherein L is less than M.

According to a fourth aspect, an RF switch is provided, comprising: a first FET switch stack comprising N FETs connected in series between a first RF terminal and a second RF terminal; a second FET switch stack comprising M FETs connected in series between the second RF terminal and a ground node; a gate bias control ladder for the second FET switch stack, the gate bias control ladder comprising a plurality of rung branches and a plurality of rail branches, each rail branch being connected between two rung branches, each rung branch being connected between one or more rail branches and a gate of a FET switch in the second FET switch stack; a gate bias control feed for the second FET switch stack, the gate bias control feed comprising a plurality of bypassable resistors connected in series and L bypass switches, each bypass switch being connected across one or more corresponding bypassable resistors, the gate bias control feed for the second FET switch stack being coupled to the gate bias control ladder for the second FET switch stack; and wherein L is less than or equal to one half M.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
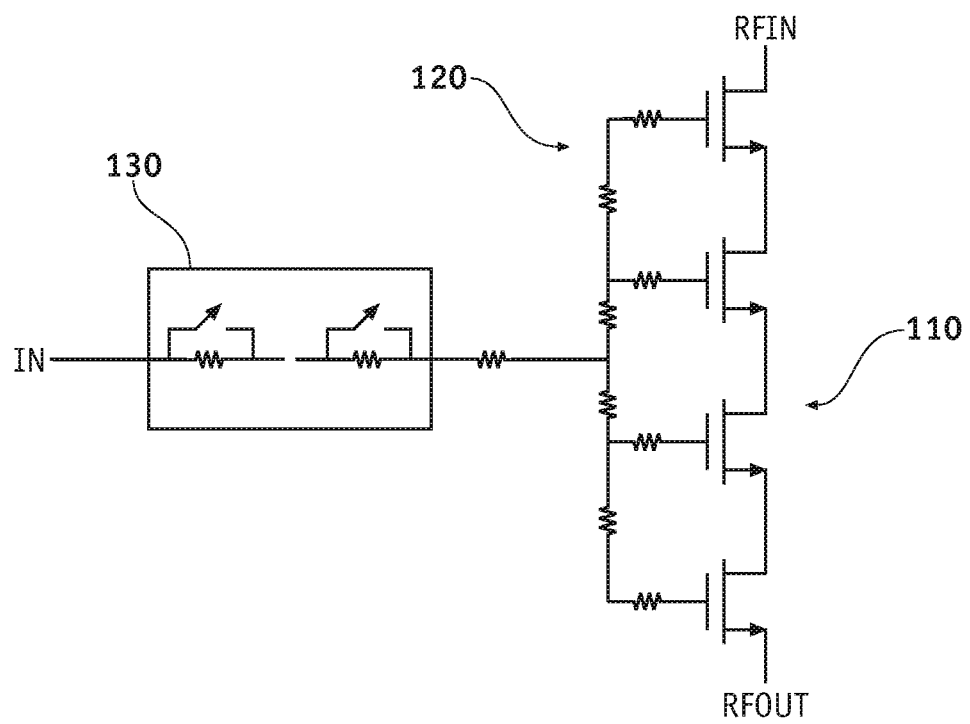
FIG. 1 shows a prior art FET switch with a single center feed for the gate of the FETs of the main switch.
Figure 2:
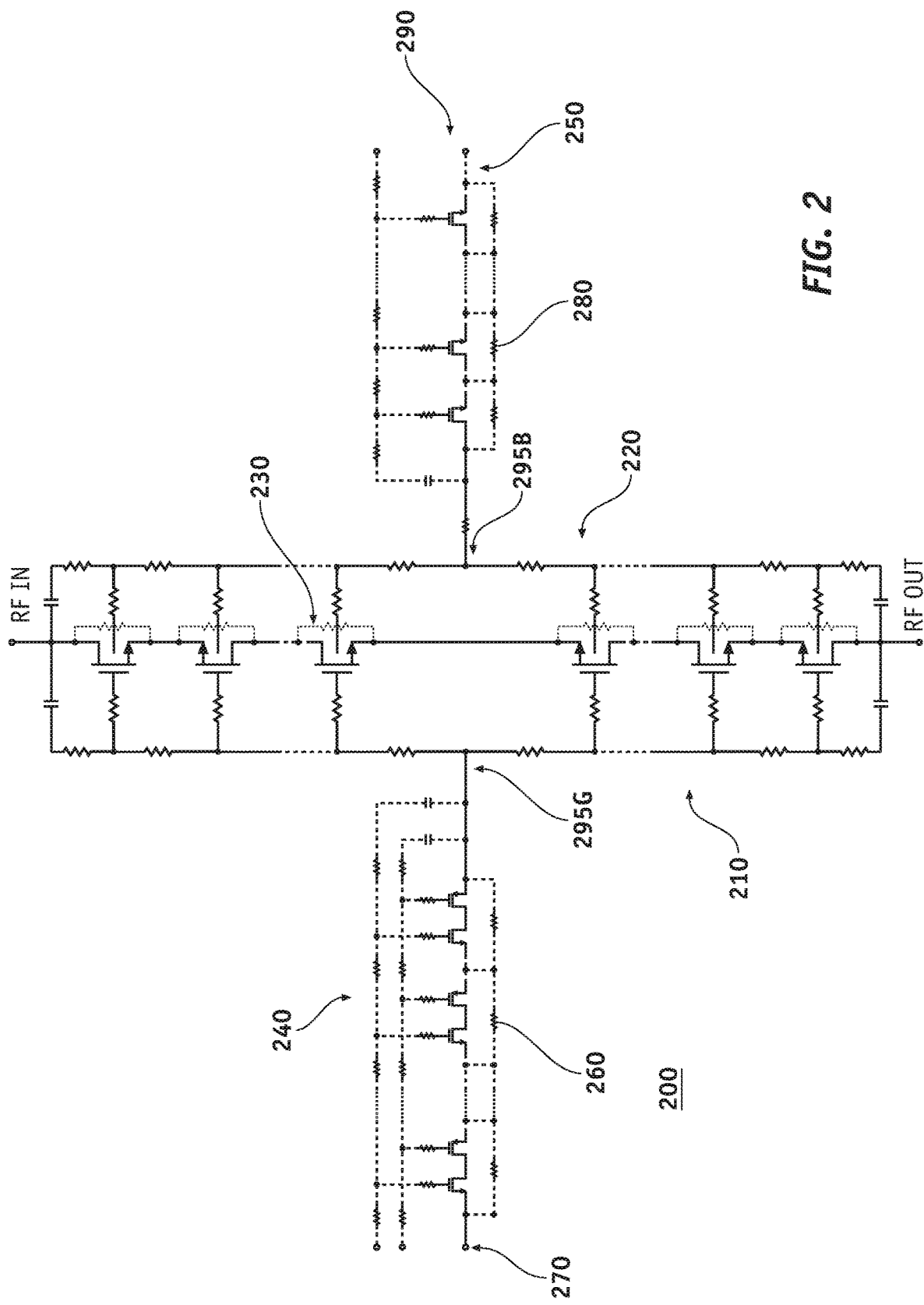
FIG. 2 shows a series switch with a single center feed for the gate and body of the FETs of the main switch.

FIG. 2 shows a schematic representation of an RF switch FET stack (200) with input RFIN and output RFOUT. FET stack (200) is biased through resistor networks, such as gate (210), body (220), and drain/source (230) resistor ladders. FET stack (200) also includes a gate control block or feed arrangement (240) and/or a body control block or feed arrangement (250) to control the bias on the gate and/or body terminals of the FETs of the FET stack. Gate feed arrangement (240) includes one or more transition-dependent gate bias feed bypass resistors across NMOS/PMOS switch pairs (also called dynamic resistors), as described, for example, in the above-mentioned U.S. patent application Ser. No. 17/374,927, incorporated herein by reference in their entirety. In particular, the resistors (260) of the gate feed arrangement (240) are bypassed during at least a portion of transitions of the input signal (270) from high to low and vice versa. On the other hand, body feed arrangement (250) includes an arrangement (plurality of NMOS bypass switches) shown, for example, in the above-mentioned U.S. patent application Ser. No. 17/321,363, also incorporated herein by reference in its entirety. The resistors (280) of the body feed arrangement (250) are bypassed during the steady OFF state of the input signal.

FIG. 2 shows an implementation with a single center feed (295G, 295B) for the respective gate and body of the FETs of the main RF switch. Assuming, for example, that the main RF switch contains twenty-eight FETs where FET #1 is at the bottom of the stack and FET #28 is at the top of the stack, feed points (295G) and (295B) will be located approximately at the height of FET #14 of the stack. In other words, a position of a FET switch inside the stack of FETs defines a corresponding height in the stack, going from a minimum height corresponding to FET #1 to a maximum height corresponding to FET #28. During the transition of the main RF switch from ON to OFF and vice versa, the gate and body nodes that are farthest away from the center feed (i.e. the top node close to e.g. FET #28 and the bottom node close to FET #1) will take the longest time to change to their final values. In other words, the farthest gate and body nodes will decide the settling time of the main RF switch. The RC time constant of the farthest gate node for the center feed network of FIG. 2 can be qualitatively exemplified as follows (where the terms $R_{RAIL}$ and $R_{RUNG}$ indicate respectively the vertical and horizontal resistance values of the gate and body ladders):

$$C_G X \left[ R_{RAIL} * \frac{N+1}{2} + R_{RUNG} \right]$$

The length of the settling time can be an undesired issue especially in case of long stacks, e.g. N=28 or more, given the direct proportionality of the time constant to the value of N, as shown in the above quantitative example.

Figure 3:
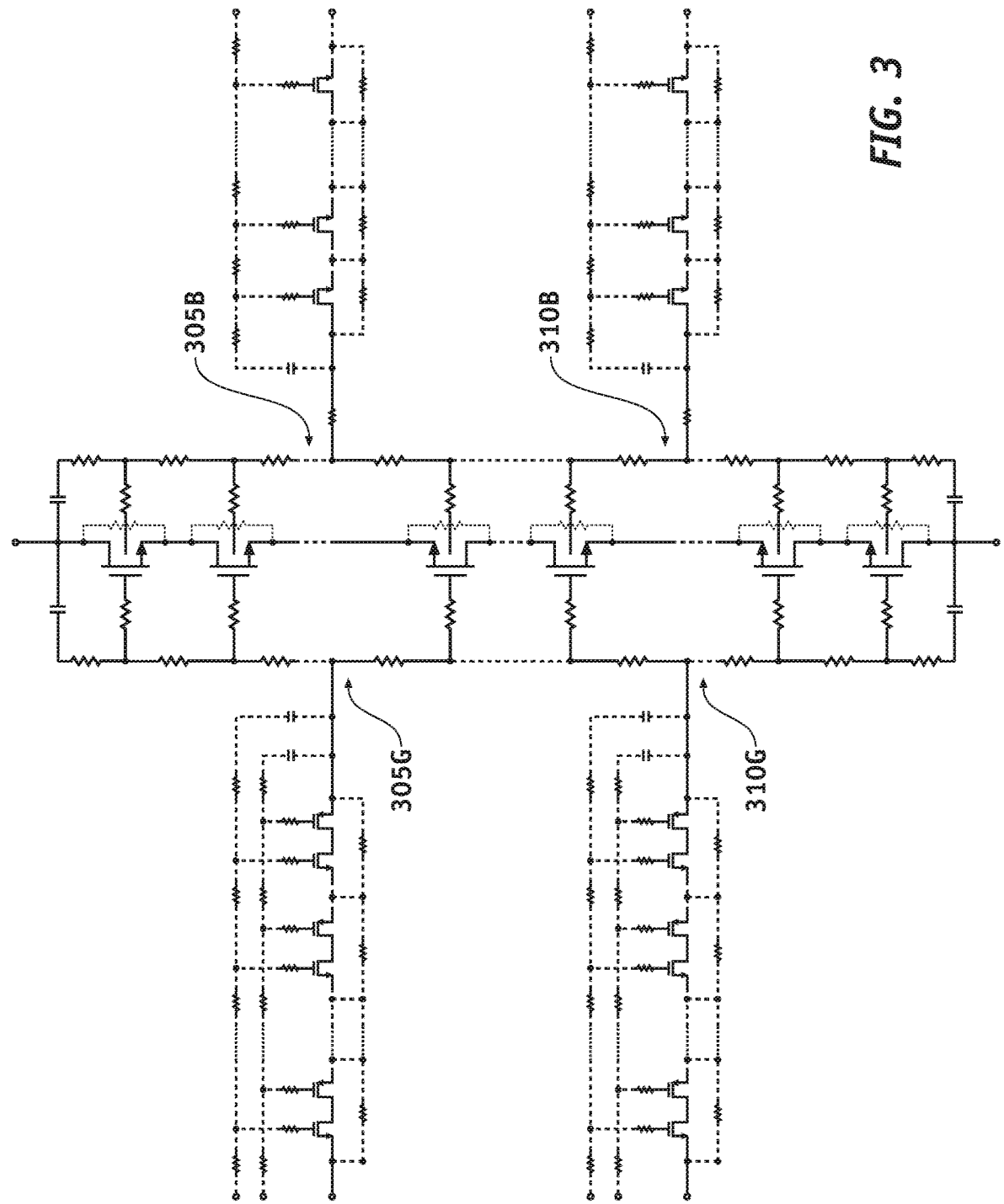
FIG. 3 shows an embodiment of the present disclosure where two separate feeds are provided on the gate and body sides of the series switch.

FIG. 3 shows an embodiment of the present disclosure where two separate charge control feeds are provided: a top feed (305G, 305B) located at one-fourth of the height down the main switch stack, and a bottom feed (310G, 310B) located at three-fourths of the height down the main switch stack. Such implementation allows to speed up the internal gate charging of the main RF switch by reducing the charging time both in the vertical (rail resistors) and horizontal (rung resistors) directions. In particular, the farthest gate and body nodes (i.e. top and bottom nodes of the stack) will have a lower RC time constant when compared with the time constant of FIG. 2 and hence a better settling profile. In particular, the RC time constant will now become as follows:

$$C_G X \left[ R_{RAIL} * \frac{N+2}{4} + R_{RUNG} \right]$$

As a consequence, the RC time constant of the embodiment of FIG. 3 has reduced to approximately half the value of FIG. 2.

The gate and/or body charge control feeds shown in FIG. 3 each comprise a plurality of bypassable resistors connected in series and a plurality of bypass switches (e.g. a plurality of NMOS/PMOS pairs), each bypass switch being connected across one or more corresponding bypassable resistors, each gate and/or body charge control feed being respectively coupled to a gate and/or body charge control ladder, the gate and/or body charge control feeds being offset from each other along the respective gate and/or body charge control ladder.

Embodiments of the present disclosure may include a gate charge control ladder only, a body charge control ladder only or both. FIG. 3 shows both of them, by way of example and not of limitation. Each charge control ladder comprises a plurality of rung branches (shown horizontally in the figure) and a plurality of rail branches (shown vertically in the figure), each rail branch being connected between two rung branches, each rung branch being connected between one or more rail branches and a body and/or gate of a FET switch in the stacked arrangement of FET switches.

While FIG. 3 shows gate and/or body rung branches with one resistor each, embodiments of the present disclosure also encompass rung branches with more than one resistor and/or rung branches with no resistor at all. Similarly, while FIG. 3 shows gate and/or body rail branches with one resistor each, embodiments of the present disclosure also encompass rail branches with more than one resistor and/or rail branches with no resistor at all.

Figure 4:
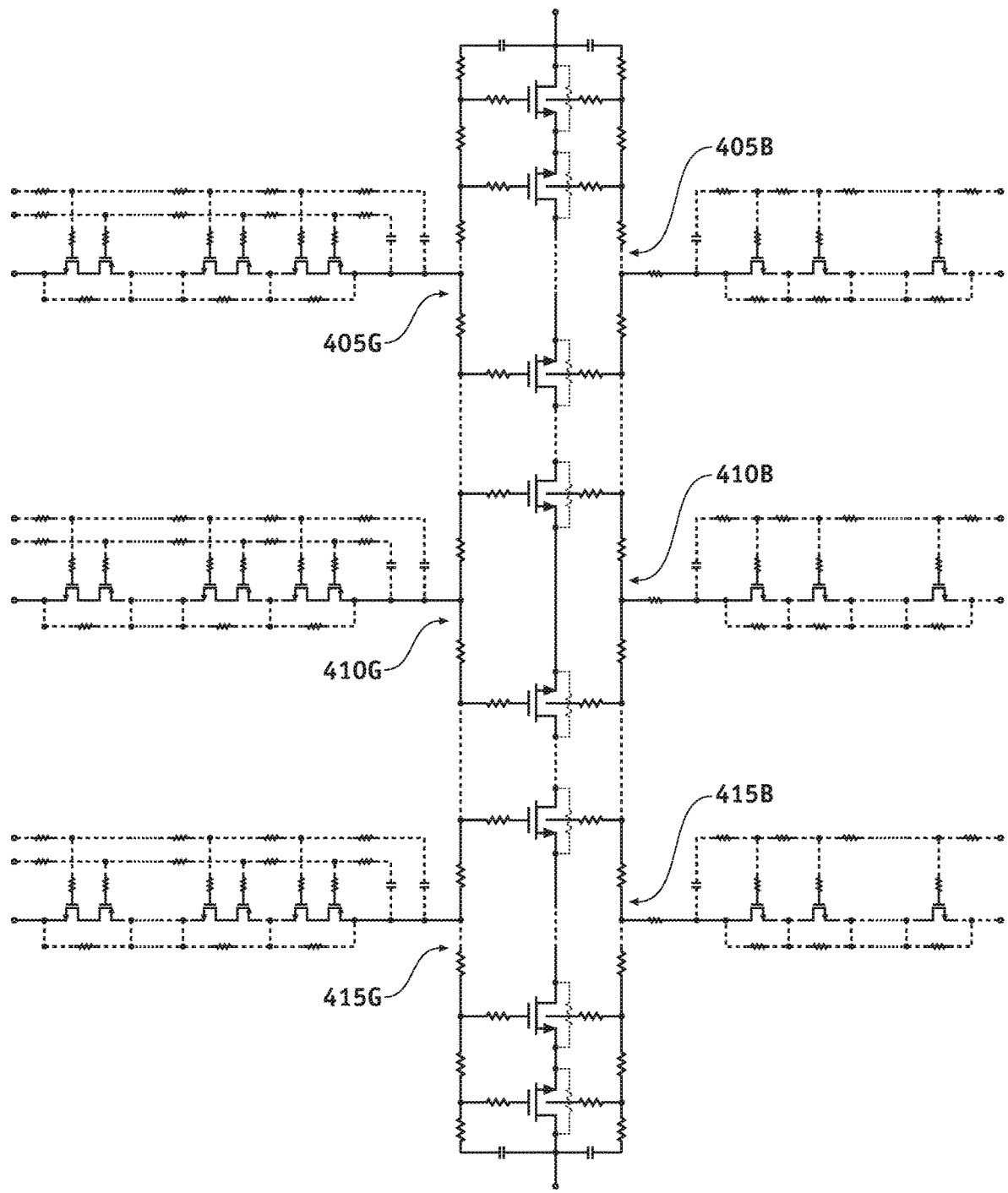
FIG. 4 shows an embodiment of the present disclosure where three separate feeds are provided on the gate and body sides of the series switch.

FIG. 4 shows a further embodiment of the present disclosure where three separate gate and/or body charge control feeds are provided: a top feed located at one-fourth of the height down the main switch stack (405G, 405B), a central feed located at half of the height down the main switch stack (410G, 410B), and a bottom feed located at three-fourths of the height down the main switch stack (415G, 415B). Such triple feed further improves the gate settling time.

In the embodiments of FIGS. 3 and 4, each feed arrangement or network includes a stacked arrangement of FET switches having a feed stack height (i.e. number of NMOS/PMOS pairs in the gate feed and number of NMOS in the body feed) at least similar or identical to the stack height (i.e. number of FETs) of the main RF switch, or more. However, while FIGS. 3-4 show implementations of the body feed arrangements identical to the gate feed arrangements, the inventors have observed that settling time during transition of the input signal on the body side is faster than on the gate side, which means that a single feed on the body side (or less feeds than on the gate side) can be enough in some embodiments.

Additionally, while a higher number of gate and/or body feed arrangements can be seen as preferred (since the higher the number of feeds the lower the settling time), such number has to be balanced with the layout of the integrated circuit on which the RF switch is fabricated. Having this in mind, the number of feed arrangements (e.g. a number M) should preferably be not greater than 15% of N (where N is the number of FETs in the main RF switch stack), and more preferably not greater than 10% of N. In terms of location, three feed arrangements may be placed at a distance of N/4 from each other (as shown in FIG. 4), four feed arrangements may be placed at a distance of N/5 from each other, and so on.

In several of the embodiments discussed above, the gate and/or body feed arrangements have a plurality of (e.g. K) bypass switches (e.g. a plurality of NMOS/PMOS transistor pairs). In some embodiments, K can be less than the number N of FETs of the main RF switch if the linearity of the bypass switches is better than the linearity of the FET switches. In other embodiments, K can be equal to N.

The teachings discussed above apply to both series switches (where the main RF switch is located between a first RF+terminal and a second RF- terminal) and shunt switches (where the main RF switch is located between an RF terminal and a reference voltage such as ground). A shunt switch usually has to handle high voltage in the OFF state. On the other hand, a series switch will need to handle high voltage in both ON and OFF states.

Figure 5:
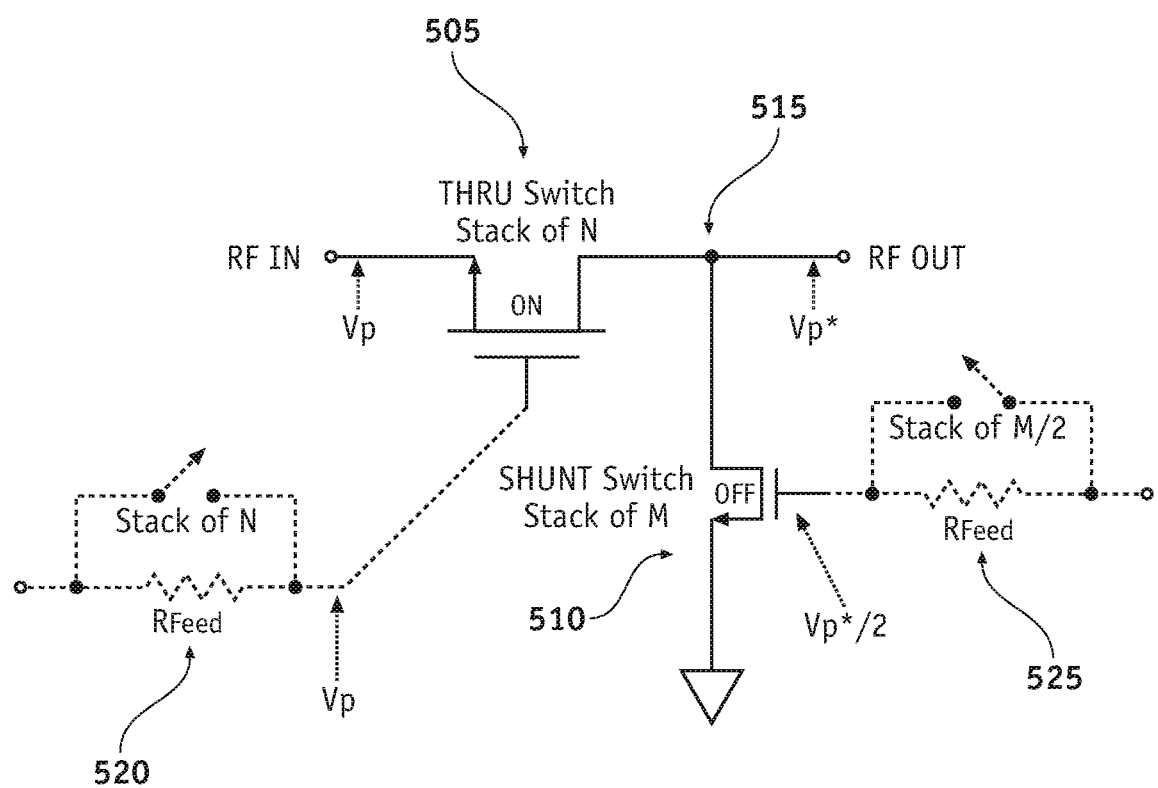
FIG. 5 shows an embodiment of the present disclosure where a combination of a series switch and a shunt switch is shown, each switch having its own separate feed network.

FIG. 5 shows an embodiment of the present disclosure where a combination of an RF series switch (505, indicated as "thru switch" in the figure) and an RF shunt switch (510) is shown, both made of a stacked arrangement of FETs, with the shunt switch located at the terminal (515) of the right RF port "RF OUT" of the series switch (505), each switch being made of a stack of FETs (e.g. N FETs for the series switch and M FETs for the shunt switch, with M not necessarily equal to N) and having its own separate feed network (520, 525). In accordance with the embodiment of FIG. 5, when the series switch (505) is in the ON state, the shunt switch (510) is in the OFF state and vice versa. In particular, the shunt switch (510) is present for isolation purposes of the series switch (505) between the terminals RF IN and RF OUT. For example, in case of an SP2 T (single pole double throw) switch, a similar series/shunt switch structure will be present on a different path, not shown in the figure, and RF OUT will be one of the outputs/throws of the SP2 T. If that other path is ON, the series switch (505) in FIG. 5 will be OFF, and at that time the ON status of the shunt switch (510) will provide a better isolation between the terminals RF IN and RF OUT of the series switch (505).

The term Vp shown in FIG. 5 shows the peak voltage at the input of the series switch (505), also known as Vpeak. The term Vp* shows the peak voltage at the output of the series switch (505). Such term is usually slightly lower than Vp and equals Vp in case there is no voltage drop across the series switch (505). Vp* can also be higher than Vp in cases of mismatch conditions, in which case the number M of FETs in the shunt switch is usually higher than the number N of FETs in the series switch. When the shunt switch (510) is OFF, the total voltage across the shunt switch (510) will be Vp*−0=Vp*, i.e. the shunt switch (510) will need to handle high power, and Vp* will divide from the top to the bottom of the shunt switch (510), i.e. across FETs #M through #1 of the shunt switch (510). As a consequence, the feed dynamic gate circuit (525) for the shunt switch (510) will need to handle a voltage which will depend on the location of the feed point to the shunt switch. If, for example, the feed (525) is centrally located as shown in the exemplary representation of FIG. 5, it will need to handle Vp*/2. This will have the consequence that the stack height of the shunt feed (525) (i.e. the number L of bypass switches of the shunt feed) will just need to be half of the stack height of the shunt switch, i.e. M/2. More generally, the stack height of the central feed will have a value less than M, starting from M/2.

Therefore, differently from the feed or feeds (520) on the series switch (505)—which have a minimum stack height (i.e. the number K of bypass switches of the series feed) of N to handle the full Vp—the minimum stack height of a centrally located feed (525) on the shunt switch (510) (i.e. the number L of bypass switches of the shunt feed) can be M/2. More generally, in case of a differently placed feed or multiple feeds for the shunt switch (510), depending on what the voltage is, the minimum stack height of the feed can be sized accordingly. Stated differently, such minimum stack height of the shunt feed will be, in general, a function of the coupling location of the shunt feed to the shunt switch. However, there are also embodiments where L can be less than M/2 if the linearity of the L bypass switches is better than the linearity of the M FET switches in the shunt stack. In the typical case, L is equal to M/2 for a centrally placed shunt feed.

A consequence of the lower stack heights of the feeds for the shunt switch of FIG. 5 will be a lower on-resistance Ron, which will imply a faster switching time. In some embodiments, the shunt switch (510) will not need to handle high voltage in its ON state, as in the ON state of the shunt switch (510) the series switch (505) will be OFF and will be thus able to isolate the shunt switch from high voltage Vp*. A feature and benefit of some embodiments is a gate bias control feed having a number of switches (e.g., M/2 switches versus M switches) such that the gate bias control feed has lower on-resistance Ron. A feature and benefit of some embodiments is a gate bias control feed having a level of on-resistance Ron such that settling times for the gates biased by the gate bias control feed are shorter. A feature and benefit of some embodiments is a FET switch stack having a gate biasing arrangement providing settling times for the gates that are short enough to allow the FET switch to operate at high frequencies.

Figure 6:
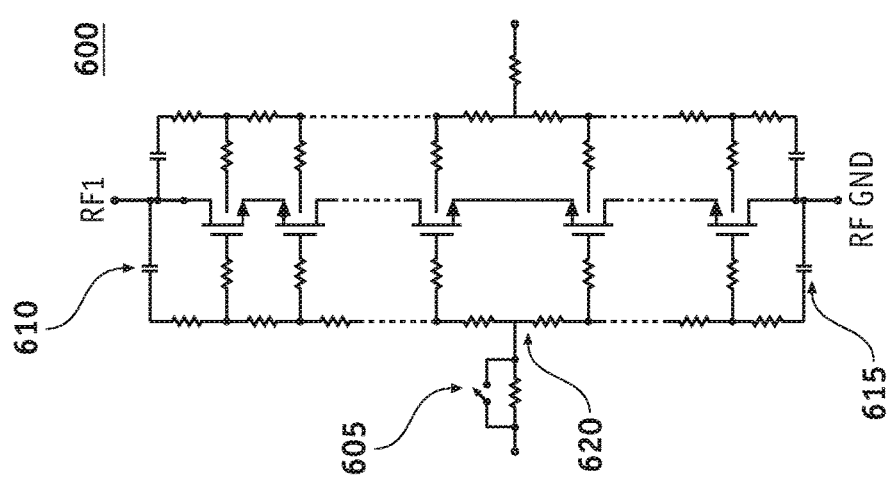
FIG. 6 shows a more detailed representation of the shunt switch of FIG. 5, with a single central feed.

FIG. 6 shows an exemplary representation (600) of the shunt switch of FIG. 5, with a single, centrally located, gate feed (605). Shown in FIG. 6 are also top and bottom antenna bias capacitors (610, 615 respectively), described as such in e.g. U.S. Pat. No. 10,236,872 incorporated herein by reference in its entirety. In particular, the additional presence of the antenna bias capacitor (615) at the bottom of the stack allows the voltage to divide equally along the stack across the rail resistors of the gate ladder, thus assuring that the center voltage at feed point (620) is indeed Vpeak/2 as required in order to allow the stack height of the feed to be at least M/2, e.g. 14 switches compared to a number of 28 FETs of the shunt switch stack.

Figure 7:
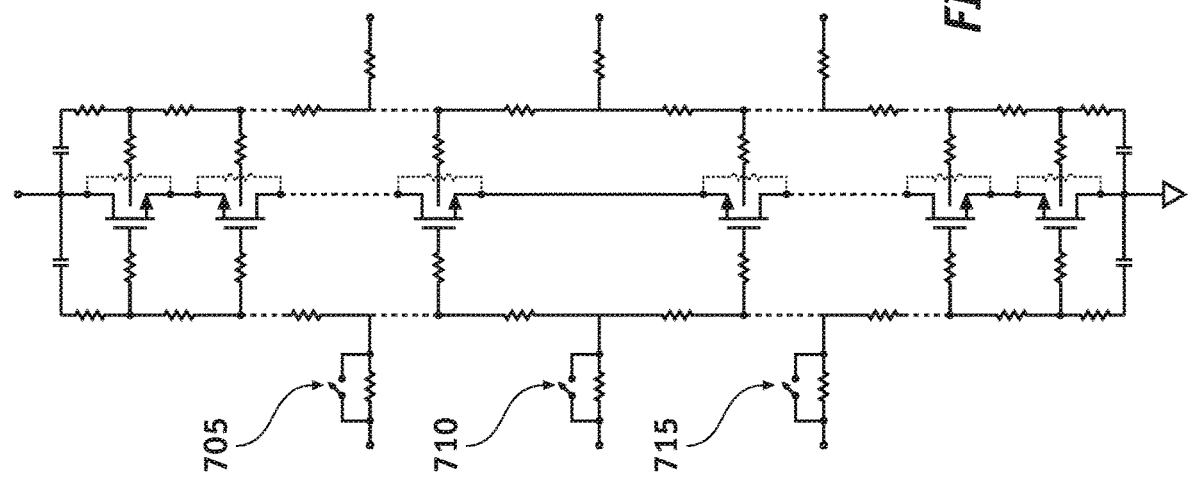
FIG. 7 shows an embodiment where three separate feeds are provided for the shunt switch of FIG. 5.

FIG. 7 shows a further embodiment where three separate feed networks (705, 710, 715) are provided for the shunt switch of FIG. 5: a top feed located at one-fourth of the height down the shunt switch stack, a central feed located at half of the height down the shunt switch stack, and a bottom feed located at three-fourths of the height down the shunt switch stack. Similarly to the previously described embodiment of FIG. 4, such triple feed further improves the settling time of the internal gates of the shunt switch. Also in this case, the location of the feed point will decide the voltage that the gate feed network needs to handle and hence decide the stack height of each feed network. Therefore, the stack height of the top feed (705) can be ¾ of the total height of the shunt stack, the stack height of the middle feed (710) can be half of the total height and the stack height of the bottom feed (715) can be ¼ of the total height. This can be contrasted with a series switch where the stack height of every feed would have to be the total height of the series switch stack.

Figure 8:
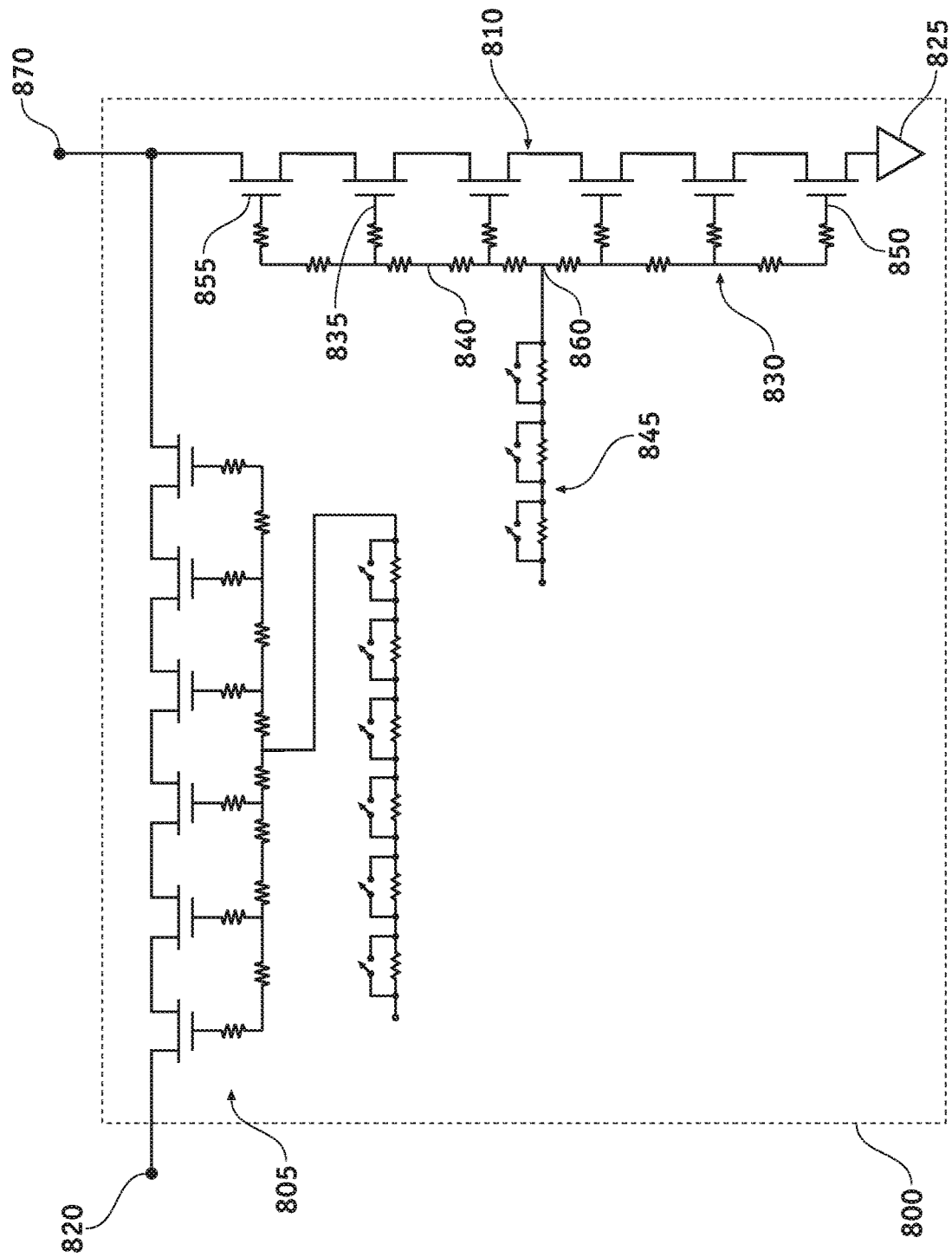
FIG. 8 shows an embodiment of an RF switch comprising a combination of a first RF switch stack and a second RF switch stack.

FIG. 8 shows a further embodiment of the present disclosure where an RF switch (800) comprising a combination of a first RF switch stack (805) and a second RF switch stack (810) is shown. RF switch (800) is provided with a first RF terminal (820) and a second RF terminal (870). RF switch stack (805) comprises N FETs connected in series between the first RF terminal (820) and the second RF terminal (870). RF switch stack (810) comprises M FETs connected in series between the second RF terminal (870) and a ground node (825). FIG. 8 also shows a gate bias control ladder (830) comprising a plurality of rung branches (835) and a plurality of rail branches (840). As shown in the figure, each rail branch is connected between two rung branches. On the other hand, each rung branch is connected between one or more rail branches and a gate of a FET switch in the RF switch stack (810). Also shown is a gate bias control feed (845) coupled to the gate bias control ladder (830), the gate bias control feed (845) comprising a plurality of bypassable resistors and L bypass switches, each connected across one or more corresponding bypassable resistors. In the embodiment of FIG. 8, L is less than or equal to M/2.

With continued reference to FIG. 8, the RF switch stack (810) comprises a bottom FET switch (850) connected to the ground node (825) and a top FET switch (855) connected to the second RF terminal (870). The RF switch stack (810) has a height extending between the bottom FET switch (850) and the top FET switch (855). The gate bias control feed (845) is coupled to the gate bias control ladder at a location (860) corresponding to one half the height of the RF switch stack (810).

Figure 9:
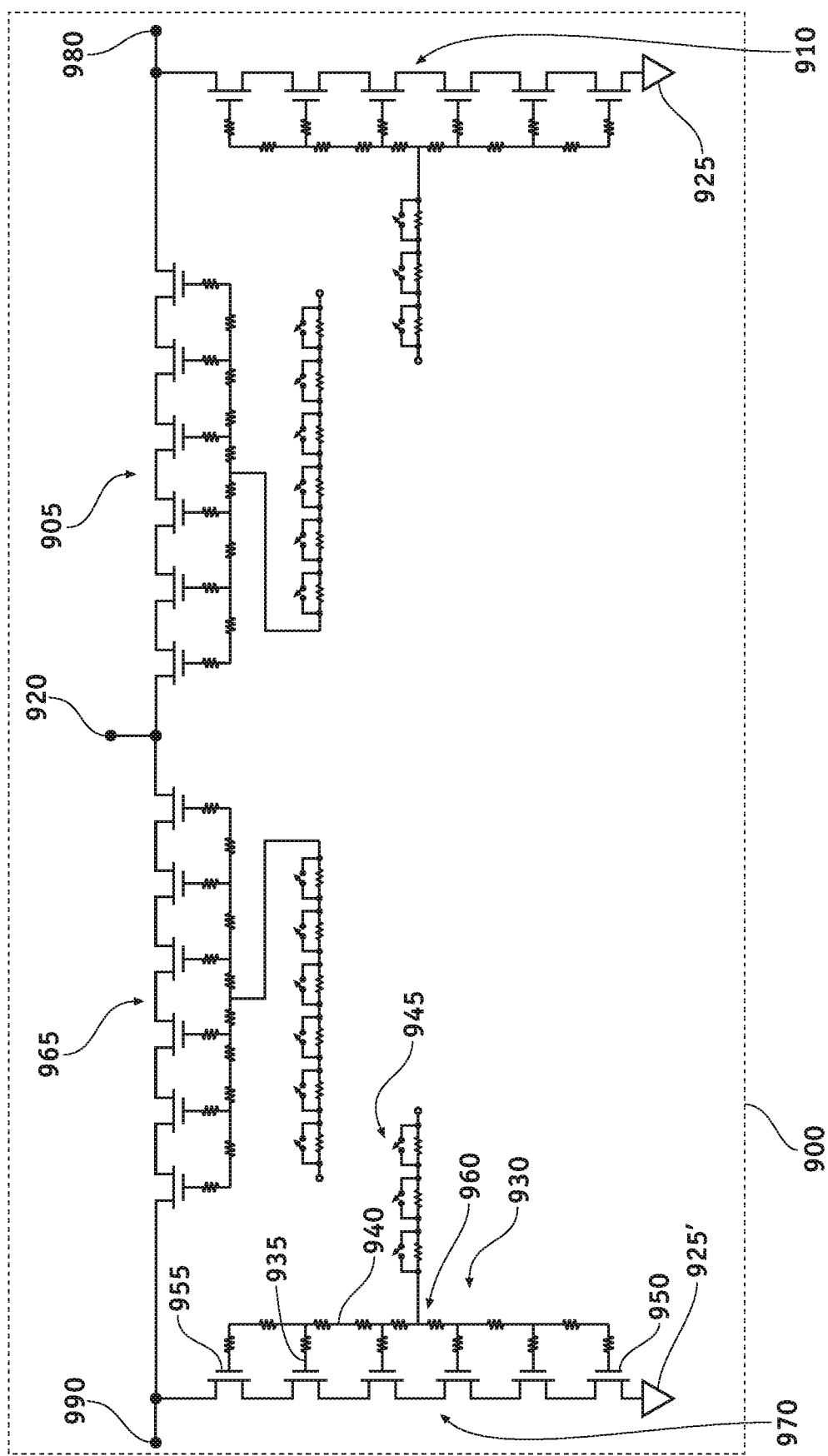
FIG. 9 shows an embodiment of an RF switch comprising a combination of a first RF switch stack, a second RF switch stack, a third RF switch stack and a fourth RF switch stack.

FIG. 9 shows yet another embodiment of the present disclosure, where an RF switch (900) with four RF switch stacks (905, 910, 965, 970), three RF terminals (920, 980, 990), and a ground node (925, 925') is shown. Apart from switch stacks (905, 910) the structure of which is similar to the one of switch stacks (805, 810) of FIG. 8, a third FET switch stack (965) is shown, comprising N FETs connected in series between first RF terminal (920) and third RF terminal (990). Additionally, a fourth FET switch stack (970) is also shown, comprising M FETs connected in series between the third RF terminal (990) and the ground node (925'). FIG. 9 also shows a gate bias control ladder (930) for the switch stack (970), comprising a plurality of rung branches (935) and a plurality of rail branches (940). As shown in the figure, each rail branch is connected between two rung branches. On the other hand, each rung branch is connected between one or more rail branches and a gate of a FET switch in the RF switch stack (970). Also shown is a gate bias control feed (945) coupled to the gate bias control ladder (930), the gate bias control feed (945) comprising a plurality of bypassable resistors and L bypass switches, each connected across one or more corresponding bypassable resistors. In the embodiment of FIG. 9, L is less than or equal to M/2.

With continued reference to FIG. 9, the RF switch stack (970) comprises a bottom FET switch (950) connected to the ground node (925') and a top FET switch (955) connected to the third RF terminal (990). The RF switch stack (970) has a height extending between the bottom FET switch (950) and the top FET switch (955). The gate bias control feed (945) is coupled to the gate bias control ladder at a location (960) corresponding to one half the height of the RF switch stack (970).

Figure 10:
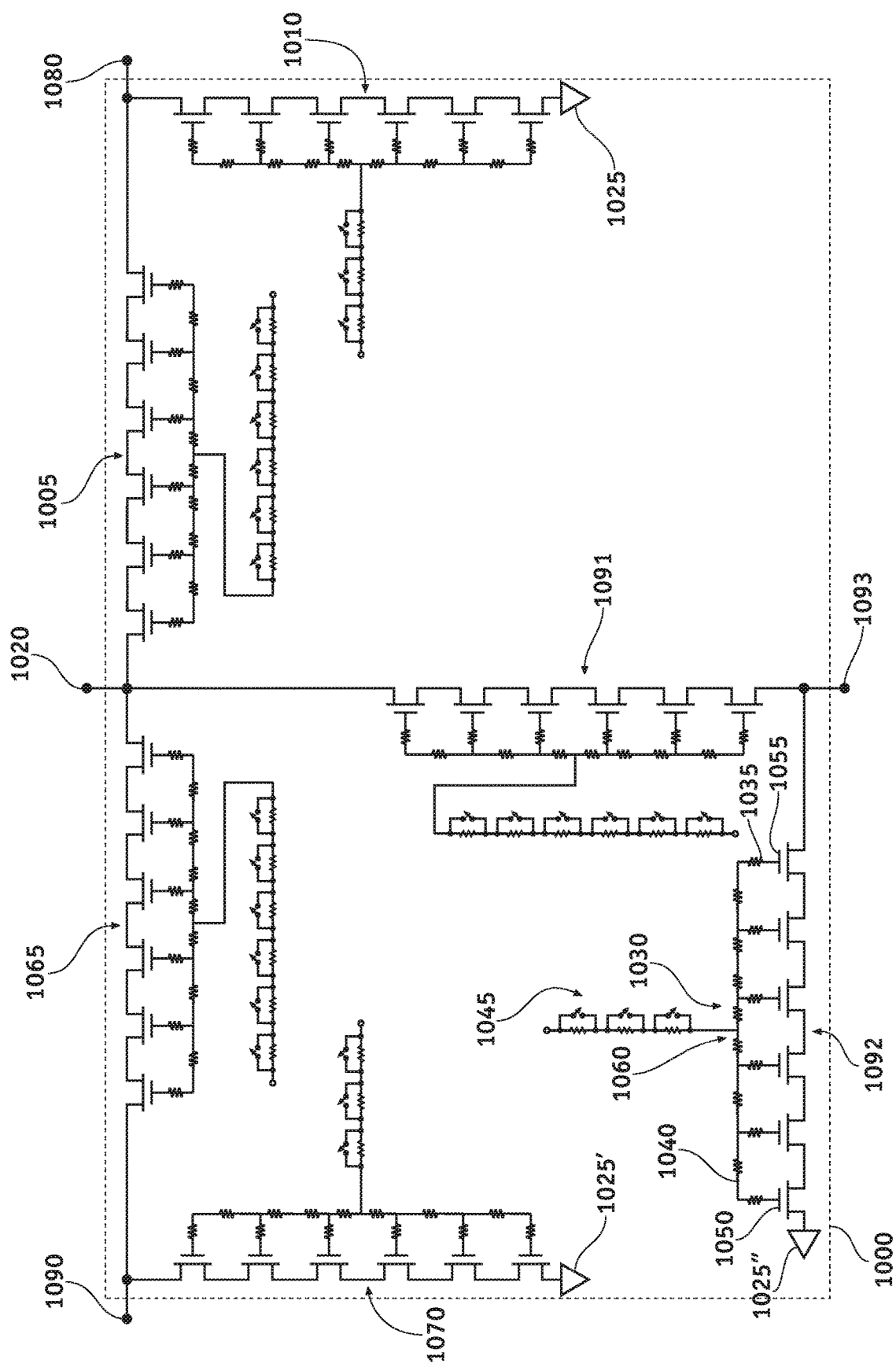
FIG. 10 shows an embodiment of an RF switch comprising a combination of a first RF switch stack, a second RF switch stack, a third RF switch stack, a fourth RF switch stack, a fifth RF switch stack and a sixth RF switch stack.

FIG. 10 shows a further embodiment of the present disclosure, where an RF switch (1000) with six RF switch stacks (1005, 1010, 1065, 1070, 1091, 1092), four RF terminals (1020, 1080, 1090, 1093), and a ground node (1025, 1025', 1025") is shown. Apart from switch stacks (1005, 1010, 1065, 1070) the structure of which is similar to the one of switch stacks (905, 910, 965, 970) of FIG. 9, a fifth FET switch stack (1091) is shown, comprising N FETs connected in series between first RF terminal (1020) and fourth RF terminal (1093). Additionally, a sixth FET switch stack (1092) is also shown, comprising M FETs connected in series between the fourth RF terminal (1093) and the ground node (1025"). FIG. 10 also shows a gate bias control ladder (1030) for the switch stack (1092), comprising a plurality of rung branches (1035) and a plurality of rail branches (1040). As shown in the figure, each rail branch is connected between two rung branches. On the other hand, each rung branch is connected between one or more rail branches and a gate of a FET switch in the RF switch stack (1092). Also shown is a gate bias control feed (1045) coupled to the gate bias control ladder (1030), the gate bias control feed (1045) comprising a plurality of bypassable resistors and L bypass switches, each connected across one or more corresponding bypassable resistors. In the embodiment of FIG. 10, L is less than or equal to M/2.

With continued reference to FIG. 10, the RF switch stack (1092) comprises a bottom FET switch (1050) connected to the ground node (1025") and a top FET switch (1055) connected to the fourth RF terminal (1092). The RF switch stack (1092) has a height extending between the bottom FET switch (1050) and the top FET switch (1055). The gate bias control feed (1045) is coupled to the gate bias control ladder at a location (1060) corresponding to one half the height of the RF switch stack (1092).

Figure 11:
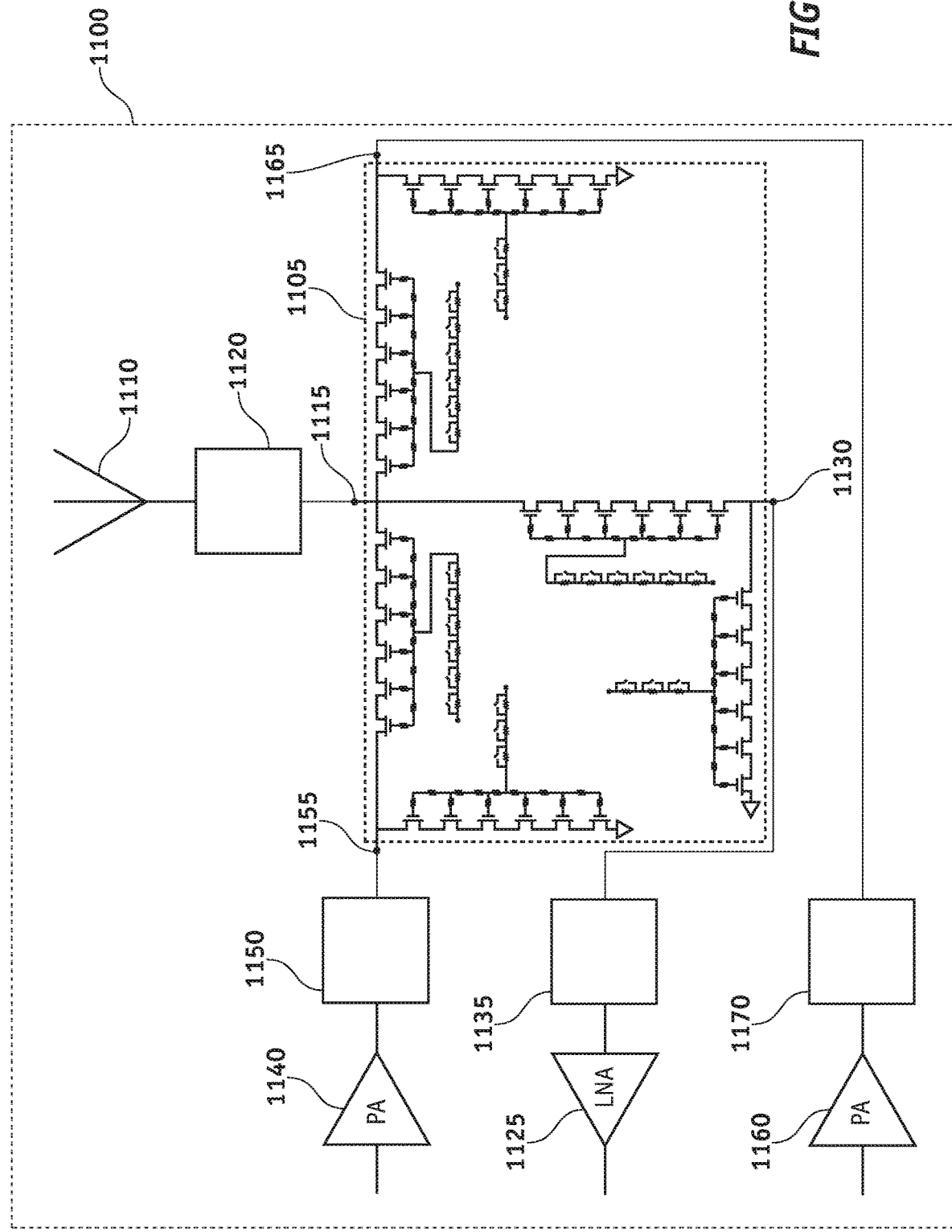
FIG. 11 shows an embodiment of a wireless communication device including an RF switch.

FIG. 11 shows yet another embodiment of the present disclosure, where a wireless communication device (1100) including an RF switch (1105) is shown. RF switch (1105) can be any of the RF switches discussed so far. Antenna (1110) is connected to RF switch (1105) through common node (1115). If desired or needed, an intermediate device (1120) (e.g. an antenna matching circuit) can be connected between antenna (1110) and RF switch (1105). FIG. 11 also shows a low noise amplifier (LNA) (1125) connected to one (1130) of the RF terminals of the RF switch (1105). If desired or needed, an intermediate device (1135) (e.g. a filter) can be connected between LNA (1125) and RF switch (1105). FIG. 11 further shows a first power amplifier (PA) (1140) connected to another one (1155) of the RF terminals of the RF switch (1105). If desired or needed, an intermediate device (1150) (e.g. a filter) can be connected between PA (1140) and RF switch (1105). FIG. 11 also show a second power amplifier (PA) (1160) connected to yet another one (1165) of the RF terminals of the RF switch (1105). If desired or needed, an intermediate device (1170) (e.g. a filter) can be connected between (PA) (1160) and RF switch (1105).

The wireless communication device described in FIG. 11 can be implemented in one of a smartphone, a cellular phone, a personal digital assistant (PDA), a tablet, a wireless-enabled computer, a base station transceiver (BST), a WiFi access point, a WiFi router, and/or a small cell cellular radio access node.

More generally, all of the embodiments shown and discussed with reference to FIGS. 2-4 of the present application can be applied to the shunt switch of FIG. 5.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuital arrangement comprising:
   a combination of a series RF switch and a shunt RF switch, the series RF switch connected between a first RF terminal and a second RF terminal, the shunt RF switch connected between the second RF terminal and ground, the shunt RF switch configured to be in an ON steady state when the series RF switch is in an OFF steady state and vice versa, each of the series RF switch and the shunt RF switch comprising a stacked arrangement of respective N and M FET switches; and
   a plurality of series gate feed arrangements coupled to gates of the FET switches of the series RF switch, and one or more shunt gate feed arrangements coupled to gates of the FET switches of the shunt RF switch, each series gate feed arrangement and shunt gate feed arrangement comprising respective K and L bypass switches connected across one or more common gate resistors, wherein L is less than M.

2. The circuital arrangement of claim 1, wherein L is greater than or equal to M/2.

3. The circuital arrangement of claim 2, wherein L is equal to M/2.

4. The circuital arrangement of claim 2, wherein the one or more shunt gate feed arrangements are a single shunt gate feed arrangement coupled to the shunt RF switch at a central height of the stacked arrangement of M FET switches.

5. The circuital arrangement of claim 1, wherein L is less than or equal to M/2.

6. The circuital arrangement of claim 1, wherein the one or more shunt gate feed arrangements are a plurality of shunt gate feed arrangements.

7. The circuital arrangement of claim 6, wherein the plurality of series gate feed arrangements are coupled to the series RF switch at different heights of the stacked arrangement of N FET switches and the plurality of shunt gate feed arrangements are coupled to the shunt RF switch at different heights of the stacked arrangement of M FET switches.

8. The circuital arrangement of claim 1, wherein L is a function of a coupling location of each of the one or more shunt gate feed arrangements to the M FET switches of the shunt RF switch.

9. The circuital arrangement of claim 1, wherein the shunt RF switch further comprises a top antenna bias capacitor in correspondence of a top FET switch of the stacked arrangement of M FET switches and a bottom antenna bias capacitor in correspondence of a bottom FET switch of the stacked arrangement of M FET switches.

10. The circuital arrangement of claim 1, wherein the one or more shunt gate feed arrangements are a first shunt gate feed arrangement and a second shunt gate feed arrangement, the first shunt gate feed arrangement is coupled to the M FET switches at one-quarter of a height of the shunt switch and the second shunt gate feed arrangement is coupled to M FET switches at three-quarters of the height of the shunt switch.

11. An RF switch comprising:
a first FET switch stack comprising N FETs connected in series between a first RF terminal and a second RF terminal;
a second FET switch stack comprising M FETs connected in series between the second RF terminal and a ground node;
a gate bias control ladder for the second FET switch stack, the gate bias control ladder comprising a plurality of rung branches and a plurality of rail branches, each rail branch being connected between two rung branches, each rung branch being connected between one or more rail branches and a gate of a FET switch in the second FET switch stack;
a gate bias control feed for the second FET switch stack, the gate bias control feed comprising a plurality of bypas sable resistors connected in series and L bypass switches, each bypass switch being connected across one or more corresponding bypassable resistors, the gate bias control feed for the second FET switch stack being coupled to the gate bias control ladder for the second FET switch stack; and
wherein L is less than or equal to one half M.

12. The RF switch of claim 11, wherein:
the second FET switch stack comprises a bottom FET switch connected to the ground node and a top FET switch connected to the second RF terminal;
the second FET switch stack has a height extending between the bottom FET switch and the top FET switch; and
the gate bias control feed for the second FET switch stack is coupled to the gate bias control ladder for the second FET switch stack at a location corresponding to one half the height of the second FET switch stack.

13. The RF switch of claim 12, further comprising:
a third FET switch stack comprising N FETs connected in series between the first RF terminal and a third RF terminal;
a fourth FET switch stack comprising M FETs connected in series between the third RF terminal and the ground node;
a gate bias control ladder for the fourth FET switch stack, the gate bias control ladder comprising a plurality of rung branches and a plurality of rail branches, each rail branch being connected between two rung branches, each rung branch being connected between one or more rail branches and a gate of a FET switch in the fourth FET switch stack;
a gate bias control feed for the fourth FET switch stack, the gate bias control feed comprising a plurality of bypas sable resistors connected in series and L bypass switches, each bypass switch being connected across one or more corresponding bypassable resistors, the gate bias control feed for the fourth FET switch stack being coupled to the gate bias control ladder for the fourth FET switch stack;
wherein L is less than or equal to one half M.

14. The RF switch of claim 13, wherein:
the fourth FET switch stack comprises a bottom FET switch connected to the ground node and a top FET switch connected to the third RF terminal;
the fourth FET switch stack has a height extending between the bottom FET switch and the top FET switch; and
the gate bias control feed is coupled to the gate bias control ladder at a location corresponding to one half the height of the fourth FET switch stack.

15. The RF switch of claim 14, further comprising:
a fifth FET switch stack comprising N FETs connected in series between the first RF terminal and a fourth RF terminal; and
a sixth FET switch stack comprising M FETs connected in series between the fourth RF terminal and the ground node;
a gate bias control ladder for the sixth FET switch stack, the gate bias control ladder comprising a plurality of rung branches and a plurality of rail branches, each rail branch being connected between two rung branches, each rung branch being connected between one or more rail branches and a gate of a FET switch in the sixth FET switch stack;
a gate bias control feed for the sixth FET switch stack, the gate bias control feed comprising a plurality of bypas sable resistors connected in series and L bypass switches, each bypass switch being connected across one or more corresponding bypassable resistors, the gate bias control feed for the sixth FET switch stack being coupled to the gate bias control ladder for the sixth FET switch stack;
wherein L is less than or equal to one half M.

16. The RF switch of claim 15, wherein:
the sixth FET switch stack comprises a bottom FET switch connected to the ground node and a top FET switch connected to the fourth RF terminal.

the sixth FET switch stack has a height extending between the bottom FET switch and the top FET switch; and the gate bias control feed is coupled to the gate bias control ladder at a location corresponding to one half the height of the sixth FET switch stack.

17. A wireless communication device comprising:

the RF switch of claim 15;

an antenna connected to the common node;

a low noise amplifier (LNA) connected to one of the RF terminals; and a power amplifier (PA) connected to another one of the RF terminals.

18. The wireless communication device of claim 17, further comprising an intermediate device connected between the antenna and the selected RF terminal.

19. The wireless communication device of claim 18, wherein the intermediate device comprises an antenna matching circuit.

20. The wireless communication device of claim 19, further comprising an intermediate device connected between the LNA and the selected RF terminal.

21. The wireless communication device of claim 20, wherein the intermediate device comprises a filter.

22. The wireless communication device of claim 21, further comprising an intermediate device connected between the PA and the selected RF terminal.

23. The wireless communication device of claim 22, wherein the intermediate device comprises a filter.

* * * * *